(12) United States Patent
Ou

(10) Patent No.: US 7,349,681 B2
(45) Date of Patent: *Mar. 25, 2008

(54) SELF-BIASED HIGH-SPEED RECEIVER

(75) Inventor: Chiung-Ting Ou, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 424 days.

This patent is subject to a terminal disclaimer.

(21) Appl. No.: 10/889,733

(22) Filed: Jul. 13, 2004

(65) Prior Publication Data

US 2006/0014514 A1    Jan. 19, 2006

(51) Int. Cl.
 *H04B 1/16* (2006.01)
 *G11C 5/14* (2006.01)
 *G05F 1/10* (2006.01)
 *H03F 3/45* (2006.01)

(52) U.S. Cl. .................. 455/343.1; 455/127.1; 455/572; 327/530; 327/535; 330/252; 330/261; 330/277

(58) Field of Classification Search ............. 455/572, 455/127.1, 343.1, 333, 334; 327/530, 534, 327/535; 330/252, 261, 277
See application file for complete search history.

(56) References Cited

U.S. PATENT DOCUMENTS

| | | | |
|---|---|---|---|
| 4,937,476 A | 6/1990 | Bazes | |
| 4,958,133 A | 9/1990 | Bazes | |
| 5,814,899 A * | 9/1998 | Okumura et al. | 307/64 |
| 6,108,262 A * | 8/2000 | Itoh et al. | 365/229 |
| 6,278,323 B1 | 8/2001 | Bazes | |
| 6,307,236 B1* | 10/2001 | Matsuzaki et al. | 257/392 |
| 6,469,579 B2 | 10/2002 | Bazes | |
| 6,515,547 B2* | 2/2003 | Sowlati | 330/311 |
| 6,566,926 B1* | 5/2003 | Patterson | 327/206 |
| 6,924,702 B2* | 8/2005 | Chen | 330/253 |
| 6,967,532 B2* | 11/2005 | Tan | 330/253 |
| 7,135,925 B2* | 11/2006 | Poulton | 330/253 |
| 2005/0168262 A1* | 8/2005 | Wang | 327/333 |

* cited by examiner

*Primary Examiner*—Duc M. Nguyen
(74) *Attorney, Agent, or Firm*—Slater & Matsil, L.L.P.

(57) ABSTRACT

A self-biased high-speed receiver is described. The receiver is powered by one power supply with the core operation voltage and one power supply with the IO operation voltage. The receiver is self-biased to provide a stable bias voltage. A reference voltage and an IO signal are applied on the receiver so that the difference is amplified. Thick oxide transistors are used to increase the operation voltage of the transistors. Native thick oxide transistors are used so that the receiver can work with low command mode input.

38 Claims, 5 Drawing Sheets

SELF-BIASED HIGH-SPEED RECEIVER

FIELD OF INVENTION

This invention relates generally to the MOS integrated circuits and more particularly to a high-speed IO signal receiver that can be used in deep submicron technology.

BACKGROUND

An IO signal can be received by a receiver that detects the IO signal and amplifies it. The IO signal is then input to a core circuit for further processing. Since the IO signal is not generated by the core circuit, its amplitude is not limited by the core circuit's power supply voltage (also known as the core operation voltage or $V_{dd}$). The amplitude of the IO signal may be as high as the IO circuit's power supply voltage (also known as the IO operation voltage or $V_{ddio}$). Therefore, the core circuit that directly takes input from an IO signal receiver must be able to handle an IO signal with amplitude of $V_{ddio}$.

In a traditional circuit that employs micron technology or earlier technologies, the operation voltage of the core circuit was in a range of about 2.5V to 3.3V, similar to the IO operation voltage of 3.3V to 5.0V, so that amplified IO signal can be directly input to a core circuit since their operation voltages are in same range. However, with the integrated circuit size continuing to shrink, the core operation voltage is lowered. For example, a circuit made with sub micron technology (0.5 to 0.8 micron) has an operation voltage of about 2.5V to about 3.3V. When the deep sub micron technology is employed, the size of a circuit is further reduced to about 0.25, 0.18 or even 0.13 micron, and the operation voltage drops to around 1 volt. It is expected that the core operation voltage will continue to fall with the integrated circuit size continuing to shrink.

While the core circuit operation voltage falls, the IO circuit voltage often stays at a higher voltage. Problems can arise when a high IO signal with the amplitude $V_{ddio}$ is input to a core circuit. The core circuit can be damaged or degraded if it is only designed to handle a voltage no higher than its operation voltage $V_{dd}$. Traditionally, a differential amplifier can be used as the IO signal receiver due to the compatibility of $V_{ddio}$ and $V_{dd}$.

FIG. 1, which was taken from U.S. Pat. No. 4,958,133, illustrates a circuit schematic view of a conventional IO receiver. A reference voltage is applied at node A and an IO signal voltage is applied at node B. The IO signal is amplified and output to node OUT. It is to be noted that the power supply at node C is the same as the power supplies at nodes D and E. This circuit works fine in the micron technology. However, in deep micron technology, since the power voltage at node C is around 1V, while the input IO signal at node B is 2.5V to 3.3V, the circuit does not function correctly. The input IO signals are clamped by transistors 1b and 2b when the input signal is higher than $V_{dd}$. Transistors 1b and 2b and surrounding transistors may be damaged or degraded by voltages higher than they are designed to handle.

A solution to this problem is to use a device called level-down converter. This device takes an input signal with the amplitude of the IO operation voltage ($V_{ddio}$) and converts to a relatively low signal with the amplitude of the core operation voltage ($V_{dd}$). FIG. 2 is a schematic view of how a traditional circuit 50 works. The signal $V_{in}$ is an IO signal input. $V_{ref}$ is a reference voltage used to decide whether the input signal is a "1" or "0", and is normally a fixed voltage. The receiver circuit 52 is used to receive the input IO signal $V_{in}$ and amplify it. After amplification, the amplitude of the IO signal is $V_{ddio}$. A level-down converter 54 is used to reduce its amplitude to $V_{dd}$ before the signal is sent to a core circuit 56. Level-down converter 54 is normally a stand-alone device.

This solution has an intermediate stage at which the IO signal is amplified to a high level of $V_{ddio}$. This not only increases power consumption but also degrades the circuit response to high-speed IO signals. The response degradation was observed when the signal speed reaches several hundred mega hertz. Two factors may have contributed to the degradation. Firstly, charging a device to a higher voltage and discharging it requires more time, but the high-speed signals have only a short time to change state, so that the signals may be distorted. Secondly, an IO signal is a noise source. When a signal changes state, electromagnetic noise that interferes with other parts of the circuit are generated. A higher voltage will generate a higher amount of noise. For example, a 3.3V signal generates much higher noise than a 1.2V signal.

SUMMARY OF THE INVENTION

In one aspect, the present invention provides a new circuit that solves problems of the prior art. In the preferred embodiments, the circuit combines a stand-alone, level-down converter into the receiver circuit without degrading the lifetime or reliability of the circuit. At the same time, the circuit will have improved response to high-speed IO signals. The present invention addresses these requirements.

The preferred embodiment of the present invention is devised to provide an integrated solution of a high-speed IO signal receiver. A circuit with dual power supplies is described. The circuit has a self-biased circuit to provide a stable bias voltage. A reference voltage is provided to decide the state of an IO signal. Thick oxide transistors are used together with thin oxide transistors to match different operation voltages. The output signal has an amplitude of the core operation voltage. The integration of the signal receiver with the level-down converter minimizes the number of devices working under the high IO operation voltage and increases the work range of the receiver to a higher speed.

A variation of the high-speed signal receiver takes advantage of the very low threshold voltages of native transistors. The using of native thick oxide transistors extends the working range of the receiver to low command mode input signals.

DESCRIPTION OF DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

A preferred embodiment of a self-biased high-speed receiver is described. A variation of the present invention will then be discussed.

Figure 1:
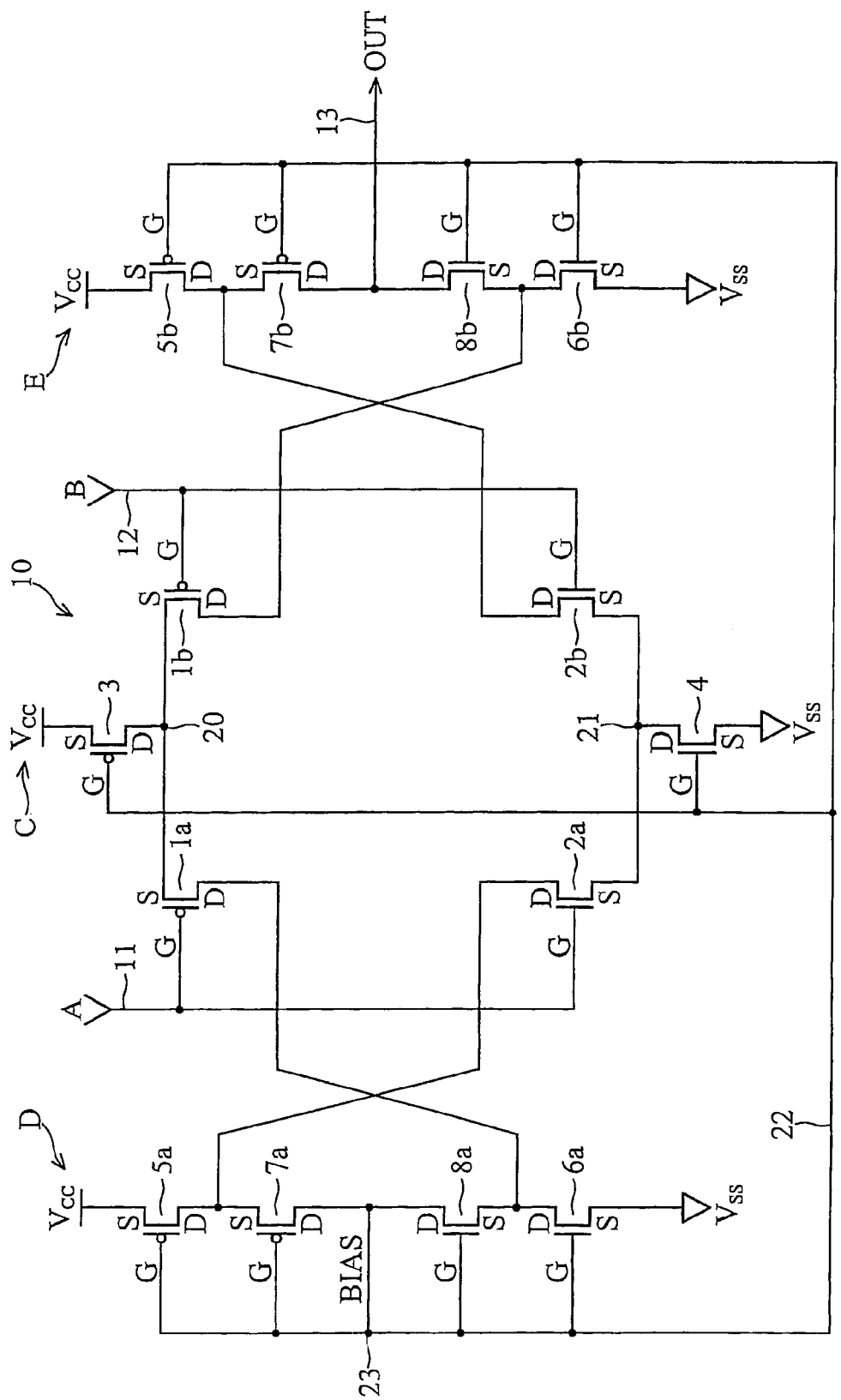
FIG. 1 is a circuit schematic diagram of a prior art.
Figure 2:
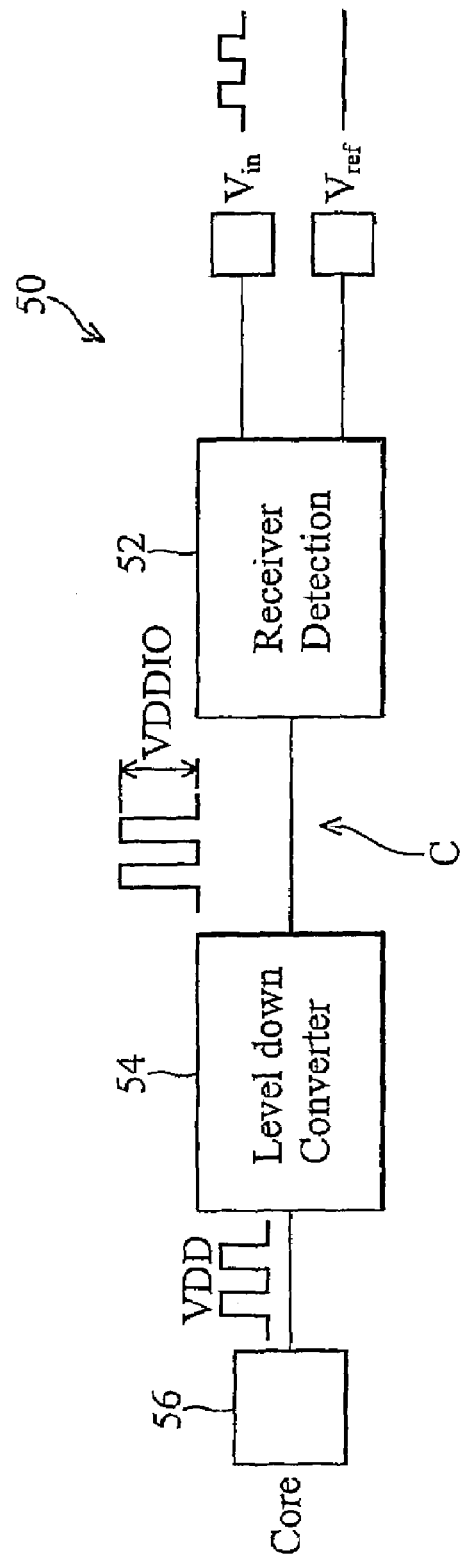
FIG. 2 is a block diagram a traditional receiver.
Figure 3:
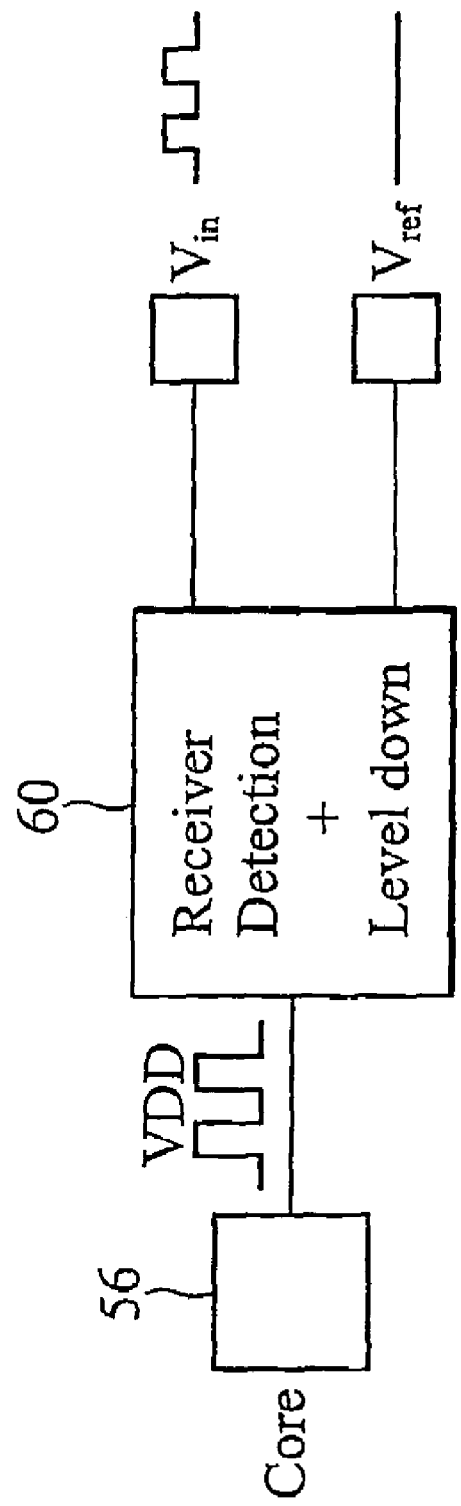
FIG. 3 is a block diagram of a preferred embodiment of the present invention.

FIG. 3 illustrates a block diagram of a first embodiment of the present invention. Compared to FIG. 2, it is noted that the IO signal detector 53 and the level-down converter 54 are integrated into one circuit 60 and the intermediate IO signal with amplitude of $V_{ddio}$ is removed. The output of the circuit 60 is provided to a core circuit 56 compatible signal with the amplitude of $V_{dd}$.

Figure 4:
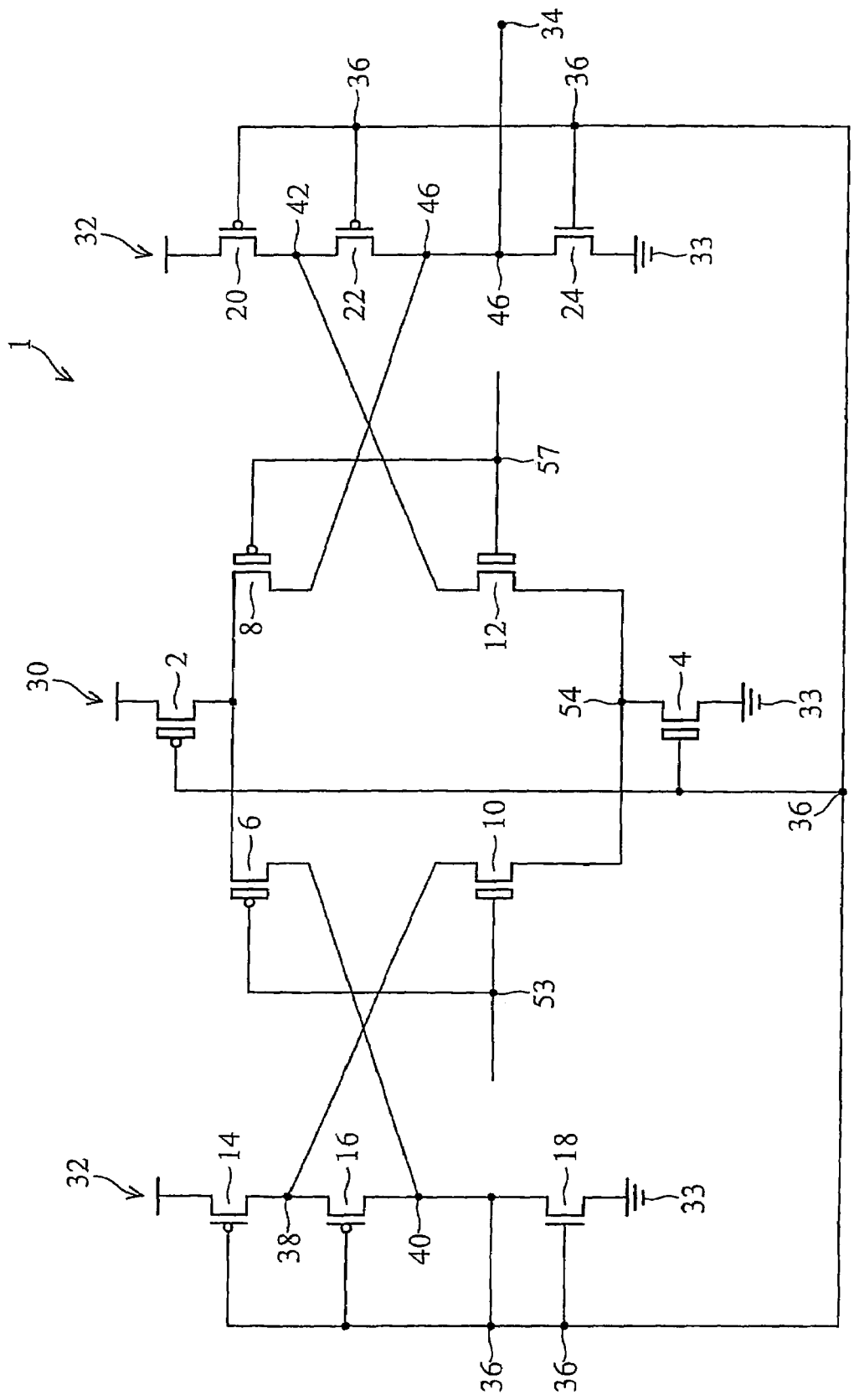
FIG. 4 is a circuit schematic diagram of the preferred embodiment.

FIG. 4 illustrates a circuit schematic diagram of the preferred embodiment circuit 1. The reference voltage $V_{dd}$ at node 32 is a power supply of the core circuit 56. Its voltage is determined by the technology used to make the core circuit. In deep micron technology, $V_{dd}$ at node 32 is typically around 1.0V to 1.5V. The supply voltage $V_{ddio}$ at node 30 is equal to the IO power supply, preferably 1.8 V to 3.3V. Other values can be used as long as they are higher than the IO signal amplitude and higher than $V_{dd}$ at node 32. The signal $V_{in}$ at node 57 is the input IO signal and the signal $V_{ref}$ at node 53 is a comparison reference voltage. An input signal $V_{in}$ that is higher than $V_{ref}$ is considered to be a high signal, or "1". Conversely, an input signal $V_{in}$ that is lower than $V_{ref}$ is considered to be a low signal, or "0". The signal $V_{in}$ has a range between the negative power supply (or the ground) and $V_{ddio}$. $V_{out}$ is the output of the receiver and is between the negative power supply (or the ground) at node 33 and $V_{dd}$.

The sub circuit made of transistors 2, 4, 6, 8, 10 and 12 has two major functions. Firstly, it provides bias current to the circuit. Secondly, it provides the first stage amplified the input signal. Transistors 6 and 8 are pMOS transistors arranged as a first differential pair having their sources coupled to each other, and transistors 10 and 12 are nMOS transistors arranged as a second differential pair of transistors having their sources coupled to each other. The two differential pairs are complementary to each other in that they comprise transistors having complimentary carrier types. This circuit has a push-and-pull effect to the nodes that are coupled to the complimentary pairs so that desired result can be maximized. The gates of transistors 6 and 10 are coupled to the reference voltage $V_{ref}$ at node 53, and the gates of transistors 8 and 12 are coupled to the input $V_{in}$ at node 57.

Transistor 2 is a pMOS transistor with its source coupled to $V_{ddio}$ at node 30. Its drain is coupled to the sources of transistors 6 and 8. Transistor 2 provides a bias current to transistors 6 and 8. Transistors 6 and 8 act as a splitter of the relatively stable bias current. The splitting of the bias current contributes to the differential amplification. If one of the transistors 6 and 8 receives more current, the other one receives less. Transistor 4 is an nMOS transistor, its source is coupled to the negative power supply or the ground. Its drain is coupled to the sources of transistors 10 and 12. Transistor 4 provides a sink for the current coming from transistors 10 and 12. Transistors 10 and 12 act as the current combiner for transistor 4. Since the drain-source current of transistor 4 is relatively stable, if one of the transistors 10 or 12 inject more current into transistor 4, the other one injects less, so that the current combiner also contributes to the differential amplification. Transistor pairs 2 and 4, 6 and 10, and 8 and 12 are complementary.

The sub circuit made of transistors 14, 16 and 18 mainly provides a stable bias voltage with the help of transistors 2, 4, 6, 8, 10 and 12. pMOS transistor 14 and nMOS transistor 18 are also a complementary pair. The drain current of transistor 14 is sourced to transistors 16 and 10. The source of transistor 18 is coupled to the negative power supply or the ground, and its drain is coupled to the drain of transistor 16. Transistor 18's gate and drain are connected together so that it is biased in its saturation region as long as its gate-source voltage $V_{gs}$ is more positive than its threshold voltage $V_{th}$. Transistor 18's gate at node 36 is also connected to the gates of transistors 16, 14, 4, 2, 22, 20 and 24, and therefore, provides a bias voltage $V_{bias}$ to them. The bias circuit generates a negative feedback. As such, if the voltage $V_{bias}$ goes up for any reason (such as process, temperature, power supply etc.), $V_{gs}$ of transistor 18 becomes higher and transistor 18 conducts more. Therefore, the drain-source voltage $V_{ds}$ of transistor 18 becomes lower. Since transistor 18's drain is coupled to its gate, the gate voltage, or $V_{bias}$ becomes lower, therefore the shift of $V_{bias}$ is corrected by the circuit itself. The negative feedback is also provided by transistors 16 and 14. When $V_{bias}$ at node 36 goes up, the gate voltages of transistors 16 and 14 go up, and the source-drain voltages $V_{sg}$ of transistors 14 and 16 become smaller, so that transistors 14 and 16 conduct less. This takes down the drain voltage of transistor 16, therefore lowers $V_{bias}$ at node 36. More important, self-bias is implemented through the six transistors in the middle of the circuit, namely, 2, 4, 6, 8, 10 and 12. For example, if $V_{bias}$ at node 36 goes up, the gate voltage of transistors 2 and 4 goes up, causing transistor 2 to conduct less, transistor 4 to conduct more, transistor 6 to conduct less, and transistor 10 to conduct more, so that the voltage at nodes 38 and 40 goes down. This takes down $V_{bias}$ at node 36. The negative feedback keeps the bias voltage stable and insensitive to the variations in processing, supply voltage, and temperature. Since the gates of transistors 16, 14 and 18 are coupled to bias voltage $V_{bias}$, the gates of transistors 6 and 8 are coupled to $V_{ref}$, and both $V_{bias}$ and $V_{ref}$ are stable. All nodes on the left side of transistors 2 and 4 have stable voltages and the current in each device is also stable.

Under a stable bias current, the sub circuit made of transistors 20, 22 and 24 can output the amplified signal. pMOS transistor 20 and nMOS transistor 24 are one complementary pair. The drain current of transistor 20 is sourced to transistors 22 and 12. The drain of nMOS transistor 12 is coupled to the output $V_{out}$ at node 34 instead of its gate and its source is coupled to a negative power supply or the ground.

The circuit 1 has a good common mode rejection. This is because transistors on the left and right side of transistors 2 and 4 are symmetrical pairs. The characteristics of transistor pairs 14 and 20, 16 and 22, 18 and 24, 10 and 12, and 6 and 8 are made to substantially match each other by design. When $V_{in}$ and $V_{ref}$ increase or decrease together, the output voltage $V_{out}$ is not affected. In other words, the voltages of $V_{ref}$ and $V_{in}$ do not affect $V_{out}$, only their difference does. The common mode rejection can be explained as such. Since the gates of transistors 14, 16, 18, 22, and 24 are all coupled to the same voltage $V_{bias}$, if $V_{ref}$ and $V_{in}$ are at the same voltage, the nodes on the left side and the corresponding nodes on the right side should be at the same voltages because circuit 1 is symmetrical. Therefore, the drain voltage of transistor 24, which is $V_{out}$ at node 34, should equal the drain voltage of transistor 18, which is also $V_{bias}$ at node 36. Considering $V_{bias}$ is stable, $V_{out}$ will not change even if $V_{ref}$ and $V_{in}$ change as long as $V_{in}$ equals $V_{ref}$.

The differential input of $V_{ref}$ and $V_{in}$ is amplified. Since the gates of transistors 24, 22, and 20 are coupled to bias voltage, their gate voltages are stable, so that the states of these transistors are controlled by $V_{in}$. The amplification of the IO signal $V_{in}$ is conducted through two paths. The first path is through transistor 12. When $V_{in}$ becomes lower, transistor 12 conducts less, so that voltage at the source of transistor 22 is higher. Since transistor 22 is a pass gate, or source follower, the drain voltage of transistor 22 is higher, and $V_{out}$ at node 34 is higher. The second path is through transistor 8, if $V_{in}$ at node 57 is lower, transistor 8 conducts more and its source voltage goes up, therefore $V_{out}$ at node 34 is higher. From the above analysis, it is found that both transistors 8 and 12 help to amplify the signal $V_{in}$. They work together to make the receiver gain higher.

$V_{ref}$ value is normally set to the middle of $V_{in}$'s fluctuation range, for example, $V_{ref}=V_{ss}+(V_{ddio}-V_{ss})/2$, where $V_{ss}$ is the negative supply voltage reference at node 33. Depending on the nature of the signal $V_{in}$, $V_{ref}$ may be set in a wide range. It is desirable that $V_{ref}$ is set in optimal range between $V_{th10}$ and $(V_{ddio}-V_{th6})$, where $V_{th10}$ is the threshold voltage of the transistor 10 and $V_{th6}$ is the threshold voltage of the transistor 6. If $V_{in}$ and $V_{ref}$ are lower than $V_{th10}$, transistors 10 and 12 are cut off, only transistors 6 and 8 conduct and amplify the signals. Likewise, if $V_{in}$ and $V_{ref}$ are higher than $(V_{ddio}-V_{th6})$, transistors 6 and 8 cut off, only transistors 10 and 12 conduct and amplify the signals. An advantage of this circuit is that when $V_{ddio}$ is coupled to 3.3V, by adjusting $V_{ref}$, different IO signals may be received without the need of changing $V_{ddio}$. This greatly simplifies the design of a circuit in which the present invention is to be used. For example, with $V_{ddio}$ equaling 3.3V, setting $V_{ref}$ to 1.65V makes the circuit work with the IO signal of 0V to 3.3V, and setting $V_{ref}$ to 0.75V makes the circuit work with the IO signal of 0V to 1.5V.

Since $V_{in}$ is an IO signal coming from an external source, its amplitude is not controlled by circuit 1. As previously stated, the highest voltage $V_{in}$ can reach is $V_{ddio}$, which may be as high as 3.3V or more. In order for the voltage not to be clamped, the source of transistor 2 is coupled to $V_{ddio}$ instead of $V_{dd}$. However, the operation voltage of devices in a deep micron circuit is around 1.0 volt, devices may degrade or be damaged if operated at higher voltages. When the difference of the core operation voltage and the IO operation voltage gets bigger, the possibility that devices are damaged is also higher. Therefore, all transistors using $V_{ddio}$ as a power supply, namely transistors 2, 4, 6, 8, 10 and 12, need to have the operation voltage of $V_{ddio}$. The present embodiment uses thick oxide transistors to achieve higher operation voltages. The thick oxide transistors have thicker gate oxide than the thin oxide transistors and have higher operation voltage, higher threshold voltage and lower speed. The thick oxide transistors used by the present invention preferably have the operation voltage of 2.5V to 3.3V, more preferably 3.3V, as 3.3V is compatible with any IO signal 3.3V or lower.

Since transistors 18, 24, 16, 22, 14 and 20 use $V_{dd}$ as the power supply, they may be made of thin oxide devices. The thin oxide transistors have lower operation voltage, higher speed and lower power consumption. The concept of thin and thick is relative. The actual thickness of the transistor gate oxide depends on the material used and the process. For example, a thin oxide transistor thickness of 17 Å to 20 Å has an operation voltage of 1.0V to 1.5V. To promote the operation voltage to about 2.5V to 3.3V, the thickness of the transistor gate oxide needs to be increased to about 45 Å to 60 Å. The making of thick oxide transistors is known in the arts of the design of chip I/O buffers and it is not in the scope of the present invention so that the details are not discussed. The separation of transistors into thick oxide transistors and thin oxide transistors has created a circuit that minimized the number of transistors that operate at the IO operation voltage.

Figure 5:
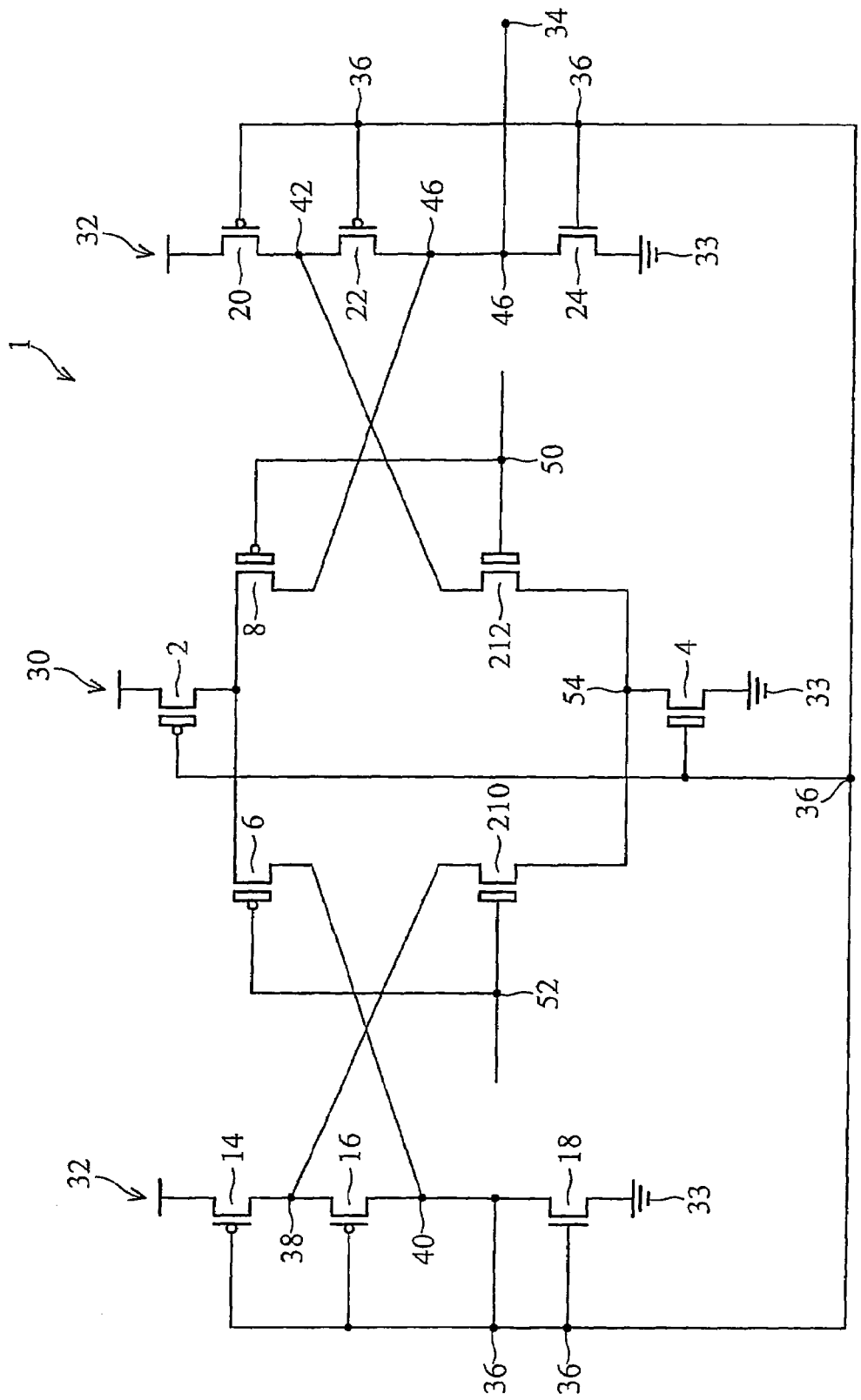
FIG. 5 is a circuit schematic diagram of another preferred embodiment of the present invention.

FIG. 5 illustrates a circuit schematic view of a variation of the preferred embodiment. The preferred embodiment described in FIG. 4 works best when $V_{in}$ and $V_{ref}$ are in the optimal range. The typical threshold voltage of a thin oxide transistor is about 0.7V, so that $V_{in}$ and $V_{ref}$ have an optimal work range of about 0.9V to about 1.8V. If $V_{in}$ and $V_{ref}$ are out of the circuit's optimal range, the amplification of the circuit is low since only part of the circuit amplifies. Also, the thick oxide transistors have higher threshold voltages than the thin oxide transistors, with a typical threshold voltage of about 0.25V to about 0.35V, so that the receiver's optimal range is further limited by using thick oxide transistors. This presents a problem for low command mode input signals. A low command mode input voltage $V_{in}$ can typically be as low as about 0.7V. To receive and amplify this low $V_{in}$ signal effectively, the $V_{ref}$ needs to be set as low as about 0. To increase the gain of the nMOS differential input transistor pair 10 and 12, a modification is made as illustrated in FIG. 5. In this embodiment, the thick oxide transistors 10 and 12 are replaced with transistors 210 and 212 that are native thick oxide transistors. Native transistors sit in wafer substrate type or in wells of the same type as the substrate. They have very low threshold voltages. It is desired that the threshold voltage be below about 0V. The making of native transistors is well known in the art.

With a low voltage threshold, transistors 210 and 212 still have gain of differential input pair. This gain can be explained from the small signal device analysis. When these transistors are turned on and operate in the saturation region, their transconductances $g_m$ contribute to the gain. If the transistor's gate-to-source voltage $V_{gs}$ is higher than its threshold voltage $V_{th}$, and its drain-to-source voltage $V_{ds}$ is equal to or higher than its gate-to-source voltage $V_{gs}$, this transistor is operating in the saturation region. In this region, assuming the signal is small, the MOS transconductance $g_m$ is $d(I_{ds})/d(V_{gs})$, where d indicates delta, or changes. In the small signal analysis, output voltage $V_{out}$ can be expressed as $(g_m V_{in})*R_o$, where $R_o$ is the small signal out impedance. The big signal $g_m$ may be distorted or degraded due to some non-linear effect. For large signal operation, the device still has enough transconductance $g_m$ if the operation region is in the saturation region.

Compared to the prior art, the present invention has several advantages. Firstly, the receiver can meet all reliability requirements in any operation mode. In the normal operation, the self-bias technique makes the circuit free from the fluctuation caused by processing, supply voltage, and temperature, etc. In the power-down mode, some transistors may be added to shut off all circuit paths and isolate the transients that may destroy or degrade the devices. The mixed $V_{ddio}$ and $V_{dd}$ scheme of the present invention has insured that the node voltages of the thin oxide transistors are less than $V_{dd}$ and the node voltages of the thick oxide devices are less than $V_{ddio}$, therefore the lifetime and reliability of the devices are not compromised.

Secondly, the level-down function is combined into the receiver. Therefore, the total power consumption is reduced by removing the stand-alone, level-down converter. By minimizing the number of transistors working under high voltage, the receiver can work to high-speed IO interface up to about 800 MHz.

Thirdly, the circuit is operational even for low command mode inputs. The extension of the operation range is due to the using of native transistors (zero threshold voltage) in the circuit.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A self-biased high-speed receiver comprising:
    a differential amplifier;
    a first input node coupled to the differential amplifier;
    a second input node coupled to the differential amplifier;
    an output node coupled to the differential amplifier;
    a bias node coupled to the differential amplifier and providing a bias voltage to the differential amplifier;
    a first power supply node at a first supply voltage coupled to the differential amplifier;
    a second power supply node at a second supply voltage, wherein the second supply voltage is higher than the first supply voltage, and wherein the second power supply node is coupled to the differential amplifier; and
    a negative power supply node at a negative supply voltage coupled to the differential amplifier.

2. The self-biased high-speed receiver of claim 1 wherein the differential amplifier further comprises:
    a first sub circuit coupled to the first input node, the second input node, the bias node, and the second power supply node;
    a second sub circuit coupled to the output node, the bias node, and the first power supply node; and
    a third sub circuit coupled to the bias node and the first power supply node.

3. The self-biased high-speed receiver of claim 2 wherein the first sub circuit comprises:
    a first transistor coupled between the second power supply node and a first node, wherein a gate of the first transistor is coupled to the bias node;
    a second transistor coupled between a second node and the negative power supply node, wherein a gate of the second transistor is coupled to the bias node;
    a third transistor having a source of the third transistor coupled to the first node, a gate of the third transistor coupled to the second input node and a drain of the third transistor coupled to the third sub circuit;
    a fourth transistor having a source of the fourth transistor coupled to the first node, a gate of the fourth transistor coupled to the first input node and a drain of the fourth transistor coupled to the second sub circuit;
    a fifth transistor having a source of the fifth transistor coupled to the second node, a gate of the fifth transistor coupled to the second input node and a drain of the fifth transistor coupled to the third sub circuit; and
    a sixth transistor having a source of the sixth transistor coupled to the second node, a gate of the sixth transistor coupled to the first input node and a drain of the sixth transistor coupled to the second sub circuit.

4. The self-biased high-speed receiver of claim 3 wherein the first, third, and fourth transistors are pMOS transistors and the second, fifth, and sixth transistors are nMOS transistors.

5. The self-biased high-speed receiver of claim 3 wherein the first, second, third, fourth, fifth, and sixth transistors are thick oxide transistors having operation voltages equal to or higher than the second supply voltage.

6. The self-biased high-speed receiver of claim 3 wherein the first, second, third, fourth, fifth, and sixth transistors are thick oxide native transistors having operation voltages equal to or higher than the second supply voltage and wherein the fifth and sixth transistors have threshold voltages close to zero.

7. The self-biased high-speed receiver of claim 2 wherein the second sub circuit comprises:
    first, second, and third transistors coupled in series and having each gate of the first, second, and third transistors coupled to the bias node;
    wherein the first transistor has a source coupled to the first power supply node;
    wherein a junction of the first and second transistors is coupled to the first sub circuit;
    wherein a junction of the second and third transistors is coupled to the first sub circuit and the output node; and
    wherein a source of the third transistor is coupled to the negative power supply node.

8. The self-biased high-speed receiver of claim 7 wherein the first and second transistors are pMOS transistors and the third transistor is an nMOS transistor.

9. The self-biased high-speed receiver of claim 2 wherein the third sub circuit comprises:
    first, second, and third transistors coupled in series and having each gate of the first, second, and third transistors coupled to the bias node;
    wherein the first transistor has a source coupled to the first power supply node;
    wherein a junction of the first and second transistors is coupled to the first sub circuit;
    wherein a junction of the second and third transistors is coupled to the first sub circuit and the bias node; and
    wherein a source of the third transistor is coupled to the negative power supply node.

10. The self-biased high-speed receiver of claim 9 wherein the first and second transistors are pMOS transistors and the third transistor is an nMOS transistor.

11. The self-biased high-speed receiver of claim 1 wherein the negative supply voltage is a ground potential at zero volts.

12. A self-biased high-speed receiver comprising:
    a differential amplifier;
    a first power supply node at a first supply voltage coupled to the differential amplifier;

a second power supply node at a second supply voltage coupled to the differential amplifier, wherein the second supply voltage is higher than the first supply voltage;

a negative power supply node at a negative supply voltage coupled to the differential amplifier;

a first input node coupled to the differential amplifier;

a second input node coupled to the differential amplifier;

an output node coupled to the differential amplifier;

a first transistor having a source coupled to the first power supply node and a gate coupled to a bias node;

a second transistor having a source coupled to the negative power supply node and a gate coupled to the bias node;

a third transistor having a source coupled to a drain of the first transistor and a gate coupled to the second input node;

a fourth transistor having a source coupled to the drain of the first transistor and a gate coupled to the first input node;

a fifth transistor having a source coupled to a drain of the second transistor and a gate coupled to the second input node;

a sixth transistor having a source coupled to the drain of the second transistor and a gate coupled to the first input node;

a seventh transistor having a source coupled to the first power supply node and a gate coupled to the bias node;

an eighth transistor having a source coupled to a drain of the seventh transistor and a gate coupled to the bias node;

a ninth transistor having a drain coupled to a drain of the eighth transistor and a gate coupled to the bias node, the ninth transistor also having a source coupled to the negative power supply node;

a tenth transistor having a source coupled to the first power supply node and a gate coupled to the bias node;

an eleventh transistor having a source coupled to a drain of the tenth transistor and a gate coupled to the bias node;

a twelfth transistor having a drain coupled to a drain of the eleventh transistor and a gate coupled to the bias node, the twelfth transistor also having a source coupled to the negative power supply node and its drain coupled to the output node;

the third transistor having a drain coupled to a junction of the eighth and ninth transistors;

the fourth transistor having a drain coupled to a junction of the eleventh and twelfth transistors;

the fifth transistor having a drain coupled to a junction of the seventh and eighth transistors; and the sixth transistor having a drain coupled to a junction of the tenth and eleventh transistors.

13. The self-biased high-speed receiver of claim 12 wherein the first, second, third, fourth, fifth, and sixth transistors are thick oxide transistors having operation voltages equal to or higher than the second supply voltage.

14. The self-biased high-speed receiver of claim 12 wherein the first, second, third, fourth, fifth, and sixth transistors are native thick oxide transistors having operation voltages equal to or higher than the second supply voltage and wherein the fifth and sixth transistors have threshold voltages close to zero volts.

15. The self-biased high-speed receiver of claim 12 wherein the first, third, fourth, seventh, eighth, tenth, and eleventh transistors are pMOS transistors.

16. The self-biased high-speed receiver of claim 12 wherein the third, fifth, seventh, eighth, and ninth transistors are substantially identical to the fourth, sixth, tenth, eleventh, and twelfth transistors, respectively.

17. The self-biased high-speed receiver of claim 12 wherein the first and second transistors are complementary transistor pairs, the third and fifth transistors are complementary transistor pairs, the fourth and sixth transistors are complementary transistor pairs, the seventh and ninth transistors are complementary transistor pairs, and the tenth and twelfth transistors are complementary transistor pairs.

18. The self-biased high-speed receiver of claim 12 wherein the negative supply voltage is a ground having zero volts.

19. A self-biased high-speed receiver comprising:

a bias current circuit;

a bias voltage circuit electrically coupled to the bias current circuit;

an output circuit electrically coupled to the bias current circuit and the bias voltage circuit;

a first power supply node at a first supply voltage coupled to the bias voltage circuit and the output circuit;

a second power supply node at a second supply voltage coupled to the bias current circuit wherein the second supply voltage is higher than the first supply voltage;

a negative power supply node at a negative supply voltage coupled to the bias voltage circuit, the bias current circuit, and the output circuit;

a first input node coupled to the bias current circuit;

a second input node coupled to the bias current circuit;

an output node at an output voltage coupled to the output circuit wherein the output voltage is an amplification of a differential voltage at the first and the second input nodes, the output voltage ranging between the first supply voltage and the negative supply voltage; and a bias node at a bias voltage coupled to the bias current circuit, the bias voltage circuit, and the output circuit.

20. The self-biased high-speed receiver of claim 19 wherein the bias current circuit provides a first source current and a first sink current to the bias voltage circuit;

wherein the bias current circuit provides a second source current and a second sink current to the output circuit; and wherein the bias voltage circuit and the bias current circuit provide the bias voltage to the bias current circuit, the bias voltage circuit, and the output circuit.

21. The self-biased high-speed receiver of claim 19 wherein the bias current circuit is adapted to provide bias current to the bias voltage circuit and the output circuit, and negative feedback to the bias voltage circuit.

22. The self-biased high-speed receiver of claim 21 wherein the bias current circuit comprises a bias current provider, a bias current splitter, and a bias current combiner.

23. The self-biased high-speed receiver of claim 22 wherein the bias current provider is adapted to provide substantially stable bias current.

24. The self-biased high-speed receiver of claim 23 wherein the bias current provider comprises a pMOS transistor and an nMOS transistor, each having a gate coupled to the bias node.

25. The self-biased high-speed receiver of claim 24 wherein the pMOS transistor and the nMOS transistor are thick oxide transistors having an operation voltage equal to or higher than the second supply voltage.

26. The self-biased high-speed receiver of claim 22 wherein the bias current splitter is adapted to split bias current to the bias voltage circuit and the output circuit.

27. The self-biased high-speed receiver of claim 26 wherein the bias current splitter comprises:

a first pMOS transistor and a second pMOS transistor each having a source coupled to the bias current provider;

the first pMOS transistor having a gate coupled to the second input node and a drain coupled to the bias voltage circuit; and the second pMOS transistor having a gate coupled to the first input node and a drain coupled to the output circuit.

28. The self-biased high-speed receiver of claim 27 wherein the first pMOS transistor and the second pMOS transistor are substantially identical thick oxide transistors having an operation voltage equal to or higher than the second supply voltage.

29. The self-biased high-speed receiver of claim 22 wherein the bias current combiner is adapted to combine bias current from the bias voltage circuit and the output circuit.

30. The self-biased high-speed receiver of claim 29 wherein the bias current combiner comprises:

a first nMOS transistor and a second nMOS transistor each having a source coupled to the bias current provider;

the first nMOS transistor having a gate coupled to the second input node and a drain coupled to the bias voltage circuit; and the second nMOS transistor having a gate coupled to the first input node and a drain coupled to the output circuit.

31. The self-biased high-speed receiver of claim 30 wherein the first nMOS transistor and the second nMOS transistor are substantially identical thick oxide nMOS transistors having an operation voltage equal to or higher than the second supply voltage.

32. The self-biased high-speed receiver of claim 31 wherein the first nMOS transistor and the second nMOS transistor are substantially identical native thick oxide nMOS transistors having an operation voltage equal to or higher than the second supply voltage and having a threshold voltage close to zero volts.

33. The self-biased high-speed receiver of claim 19 wherein the bias voltage circuit is adapted to provide the bias voltage.

34. The self-biased high-speed receiver of claim 33 wherein the bias voltage circuit comprises:

a first pMOS transistor having a source coupled to the first power supply node, a gate coupled to the bias node, and a drain coupled to the bias current circuit;

a second pMOS transistor having a source coupled to the drain of the first pMOS transistor, a gate coupled to the bias node, and a drain coupled to the bias current circuit; and a first nMOS transistor having a source coupled to the negative power supply node, a gate coupled to the bias node, and a drain coupled to the gate and to the source of the second pMOS transistor.

35. The self-biased high-speed receiver of claim 34 wherein the first pMOS transistor, the second pMOS transistor, and the first nMOS transistor are thin oxide transistors, and wherein the first pMOS transistor and the first nMOS transistor are a complementary pair.

36. The self-biased high-speed receiver of claim 19 wherein the output circuit is adapted to output the output voltage to the output node.

37. The self-biased high-speed receiver of claim 36 wherein the output circuit comprises:

a third pMOS transistor having a source coupled to the first power supply node, a gate coupled to the bias node, and a drain coupled to the bias current circuit;

a fourth pMOS transistor having a source coupled to the drain of the third pMOS transistor, a gate coupled to the bias node, and a drain coupled to the bias current circuit; and a second nMOS transistor having a source coupled to the negative power supply node, a gate coupled to the bias node, and a drain coupled to the output node and to the source of the fourth pMOS transistor.

38. The self-biased high-speed receiver of claim 37 wherein the third pMOS transistor, the fourth pMOS transistors and the second nMOS transistor are thin oxide transistors and wherein the third pMOS transistor and the second nMOS transistor are a complementary pair.

* * * * *

UNITED STATES PATENT AND TRADEMARK OFFICE
CERTIFICATE OF CORRECTION

PATENT NO. : 7,349,681 B2 Page 1 of 1
APPLICATION NO. : 10/889733
DATED : March 25, 2008
INVENTOR(S) : Ou It is certified that error appears in the above-identified patent and that said Letters Patent is hereby corrected as shown below:

In Col. 11, line 5, after "input" delete --,--.
In Col. 11, line 8, after "input" delete --,--.
In Col. 11, line 25, after "input" delete --,--.
In Col. 11, line 28, after "input" delete --,--.

Signed and Sealed this

Twenty-fourth Day of June, 2008

JON W. DUDAS
*Director of the United States Patent and Trademark Office*